United States Patent
Lin et al.

(10) Patent No.: US 11,908,961 B2
(45) Date of Patent: Feb. 20, 2024

(54) TRANSPARENT ELECTRONIC DEVICE AND MANUFACTURING METHOD THEREOF

(71) Applicant: AUO Corporation, Hsin-Chu (TW)

(72) Inventors: Yu-Ling Lin, Hsin-Chu (TW); Tsung-Ying Ke, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 0 days.

(21) Appl. No.: 17/970,866

(22) Filed: Oct. 21, 2022

(65) Prior Publication Data

US 2023/0155041 A1 May 18, 2023

(30) Foreign Application Priority Data

Nov. 16, 2021 (TW) ................................ 110142491

(51) Int. Cl.
*H01L 31/0224* (2006.01)
*H10K 85/10* (2023.01)
(Continued)

(52) U.S. Cl.
CPC .. *H01L 31/022466* (2013.01); *H01L 31/1884* (2013.01); *H10K 30/82* (2023.02); *H10K 85/10* (2023.02); *H10K 2102/00* (2023.02)

(58) Field of Classification Search
CPC ............. H01L 27/1266; H01L 27/1259; H01L 31/022466; H01L 31/1884; H10K 30/82;
(Continued)

(56) References Cited

U.S. PATENT DOCUMENTS 6,955,578 B2   10/2005   Park et al.
9,657,385 B2    5/2017   Choi et al.
(Continued)

FOREIGN PATENT DOCUMENTS

CN  103201845 A    7/2013
FR     2897746 A1 *  8/2007  ............. C03C 17/34
WO  2021120291 A1   6/2021

OTHER PUBLICATIONS

Office Action issued by (TIPO) Intellectual Property Office Ministry of Economic Affairs R.O.C. dated Jul. 4, 2022 for Application No. 110142491,Tawian.

*Primary Examiner* — Tri V Nguyen
(74) *Attorney, Agent, or Firm* — Tim Tingkang Xia, Esq.; Locke Lord LLP

(57) ABSTRACT

A transparent electronic device includes an organic film, an amorphous transparent oxycarbide layer, and a matrix layer. The organic film includes a polymer containing carboxyl groups (—COOH). The amorphous transparent oxycarbide layer is disposed on the organic film and consists of a metal element, carbon element, oxygen element and an additional element. The metal element is selected from molybdenum (Mo), indium (In), tin (Sn), zinc (Zn), cadmium (Cd) and a combination thereof. An atomic number percentage of the additional element is equal to or greater than 0%, and is less than the least of an atomic number percentage of the metal element, an atomic number percentage of the oxygen element and an atomic number percentage of the carbon element. The matrix layer is disposed on the amorphous transparent oxycarbide layer. A manufacturing method of a transparent electronic device is also provided.

10 Claims, 5 Drawing Sheets

(51) Int. Cl.
*H10K 30/82* (2023.01)
*H01L 31/18* (2006.01)
*H10K 102/00* (2023.01)

(58) Field of Classification Search
CPC .......... H10K 71/80; H10K 85/10; H01B 1/02; H01B 1/22; H01B 5/14
USPC .............................................. 428/423.1, 432
See application file for complete search history.

(56) References Cited

U.S. PATENT DOCUMENTS

2009/0153026 A1* 6/2009 Tchakarov ........... H10K 50/854
313/503
2013/0187185 A1 7/2013 Deshazer et al.

* cited by examiner

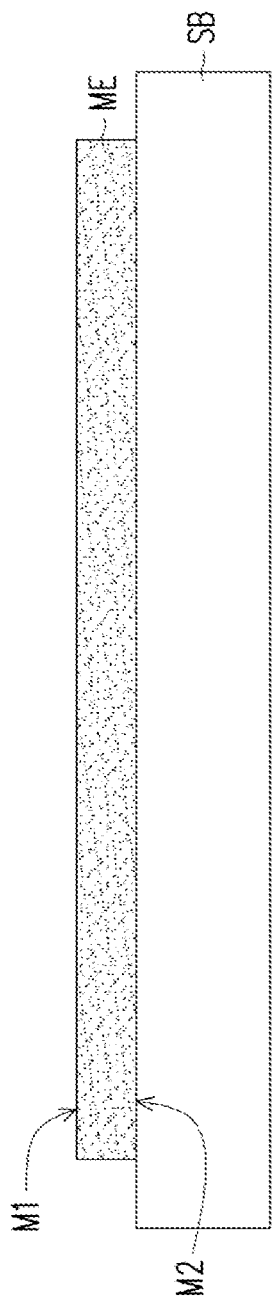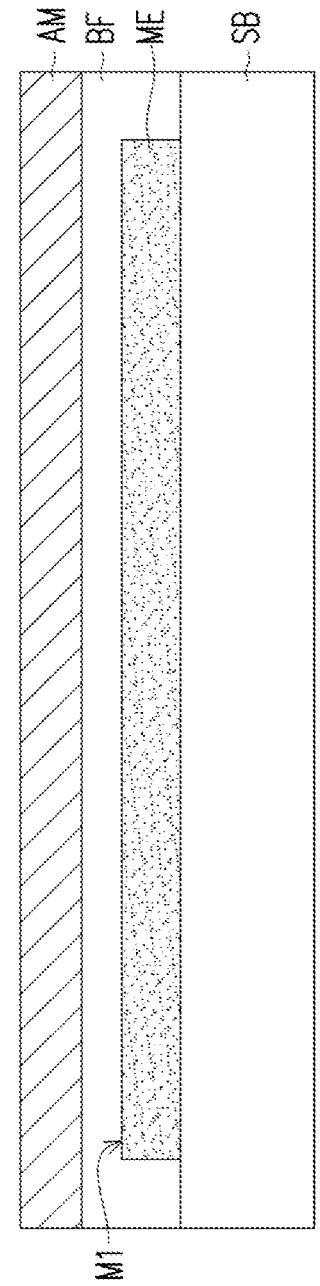

TRANSPARENT ELECTRONIC DEVICE AND MANUFACTURING METHOD THEREOF

CROSS-REFERENCE TO RELATED PATENT APPLICATION

This non-provisional application claims priority to and the benefit of, pursuant to U.S.C. § 119(a), patent application Ser. No. 11/014,2491 filed in Taiwan on Nov. 16, 2021. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to a transparent electronic device.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In the manufacturing process of a display device, in order to allow the display device to have a supporting plate with required characteristics, such as a flexible supporting plate, the substrate (such as a glass substrate) being used in the manufacturing process must be detached therefrom, and the required supporting plate is attached thereon. To easily detach the substrate, the existing method is forming an opaque strippable metal layer on the substrate, and then forming a pixel matrix on the strippable metal layer, such that the substrate and the strippable metal layer below the pixel matrix may be easily detached by the weak bonding between the substrate and the strippable metal layer. However, since the strippable metal layer is opaque, if the strippable metal layer below the pixel matrix is not removed, it is only possible to produce single-sided emitting display products, and there is no way to manufacture a transparent display product.

SUMMARY

One aspect of the present disclosure provides a transparent electronic device having high transmittance.

Another aspect of the present disclosure provides a manufacturing method of a transparent electronic device, which may form the transparent electronic device having high transmittance without removing the opaque metal layer.

In at least one embodiment of the present disclosure, a transparent electronic device is provided, including: an organic film, wherein the organic film comprises a polymer containing carboxyl groups (—COOH); an amorphous transparent oxycarbide layer, disposed on the organic film, wherein the amorphous transparent oxycarbide layer is formed by a metal element, carbon element, oxygen element and an additional element, the metal element is selected from molybdenum (Mo), indium (In), tin (Sn), zinc (Zn), cadmium (Cd) and a combination thereof, and an atomic number percentage of the additional element is equal to or greater than 0% and is less than the least of an atomic number percentage of the metal element, an atomic number percentage of the oxygen element and an atomic number percentage of the carbon element; and a matrix layer, disposed on the amorphous transparent oxycarbide layer.

In one embodiment, the atomic number percentage of the carbon element in the amorphous transparent oxycarbide layer is gradually reduced in a direction from the organic film toward the matrix layer, and the atomic number percentage of the oxygen element in the amorphous transparent oxycarbide layer is gradually increased in the direction from the organic film toward the matrix layer.

In the transparent electronic device according to one embodiment of the present disclosure, at a first side of the amorphous transparent oxycarbide layer close to the matrix layer, an average atomic number percentage of the metal element is greater than an average atomic number percentage of the carbon element, and at a second side of the amorphous transparent oxycarbide layer close to the organic film, the average atomic number percentage of the metal element is greater than or equal to the average atomic number percentage of the carbon element.

In the transparent electronic device according to one embodiment of the present disclosure, at a first side of the amorphous transparent oxycarbide layer close to the matrix layer, an average atomic number percentage of the oxygen element is greater than an average atomic number percentage of the carbon element, and at a second side of the amorphous transparent oxycarbide layer close to the organic film, the average atomic number percentage of the oxygen element is less than or equal to the average atomic number percentage of the carbon element.

In the transparent electronic device according to one embodiment of the present disclosure, the matrix layer comprises a plurality of switch elements, and a buffer layer is provided and clamped between the matrix layer and the amorphous transparent oxycarbide layer.

In the transparent electronic device according to one embodiment of the present disclosure, the transparent electronic device further includes a transparent assisting film, disposed on a surface of the organic film opposite to the amorphous transparent oxycarbide layer.

In the transparent electronic device according to one embodiment of the present disclosure, the matrix layer is a pixel layer, and the transparent electronic device is a transparent display device.

In the transparent electronic device according to one embodiment of the present disclosure, the polymer containing the carboxyl groups is selected from polyurethane, polymethyl methacrylate, polyester, polyethylene terephthalate and a combination thereof, and the additional element includes at least one of calcium (Ca), magnesium (Mg), aluminum (Al), silicon (Si) and barium (Ba).

In one embodiment of the present disclosure, a manufacturing method of a transparent electronic device is provided, including: forming a matrix layer on a first surface of an opaque metal layer; forming an organic film on a first surface of the opaque metal layer, thus forming a stack layer, wherein the organic film comprises a polymer containing carboxyl groups (—COOH); and disposing the stack layer in a processing environment in order to transform the opaque metal layer to an amorphous transparent oxycarbide layer, wherein the amorphous transparent oxycarbide layer is formed by a metal element, carbon element, oxygen element and an additional element, the metal element is selected from molybdenum (Mo), indium (In), tin (Sn), zinc (Zn), cadmium (Cd) and a combination thereof, and an atomic number percentage of the additional element is equal to or greater than 0% and is less than the least of an atomic number percentage of the metal element, an atomic number percentage of the oxygen element and an atomic number percentage of the carbon element.

In the manufacturing method according one embodiment of the present disclosure, a temperature of the processing environment is between room temperature and a melting point of the organic film, a relative humidity of the processing environment is between 70% and 100%, and a processing time of the stack layer in the processing environment is between 1 hour and 100 hour.

In the manufacturing method according one embodiment of the present disclosure,

In the manufacturing method according one embodiment of the present disclosure, the manufacturing method further includes: prior to forming the matrix layer, forming a buffer layer on the first surface of the opaque metal layer.

In the manufacturing method according one embodiment of the present disclosure, the manufacturing method further includes: forming a transparent assisting film on a surface of the organic film opposite to the amorphous transparent oxycarbide layer.

In the manufacturing method according one embodiment of the present disclosure, the atomic number percentage of the carbon element in the amorphous transparent oxycarbide layer is gradually reduced in a direction from the organic film toward the matrix layer, and the atomic number percentage of the oxygen element in the amorphous transparent oxycarbide layer is gradually increased in the direction from the organic film toward the matrix layer.

In the manufacturing method according one embodiment of the present disclosure, at a first side of the amorphous transparent oxycarbide layer close to the matrix layer, an average atomic number percentage of the metal element is greater than an average atomic number percentage of the carbon element, and at a second side of the amorphous transparent oxycarbide layer close to the organic film, the average atomic number percentage of the metal element is greater than or equal to the average atomic number percentage of the carbon element.

In the manufacturing method according one embodiment of the present disclosure, at a first side of the amorphous transparent oxycarbide layer close to the matrix layer, an average atomic number percentage of the oxygen element is greater than an average atomic number percentage of the carbon element, and at a second side of the amorphous transparent oxycarbide layer close to the organic film, the average atomic number percentage of the oxygen element is less than or equal to the average atomic number percentage of the carbon element.

In the manufacturing method according one embodiment of the present disclosure, the matrix layer comprises a plurality of switch elements.

In the manufacturing method according one embodiment of the present disclosure, the matrix layer is a pixel layer, and the transparent electronic device is a transparent display device.

In the manufacturing method according one embodiment of the present disclosure, the polymer containing the carboxyl groups is selected from polyurethane, polymethyl methacrylate, polyester, polyethylene terephthalate and a combination thereof, and the additional element includes at least one of calcium (Ca), magnesium (Mg), aluminum (Al), silicon (Si) and barium (Ba).

These and other aspects of the present disclosure will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 1A to FIG. 1D are sectional schematic views of the process of a manufacturing method of a transparent electronic device 10 according to one embodiment of the present disclosure.

DETAILED DESCRIPTION

Figure 1C:
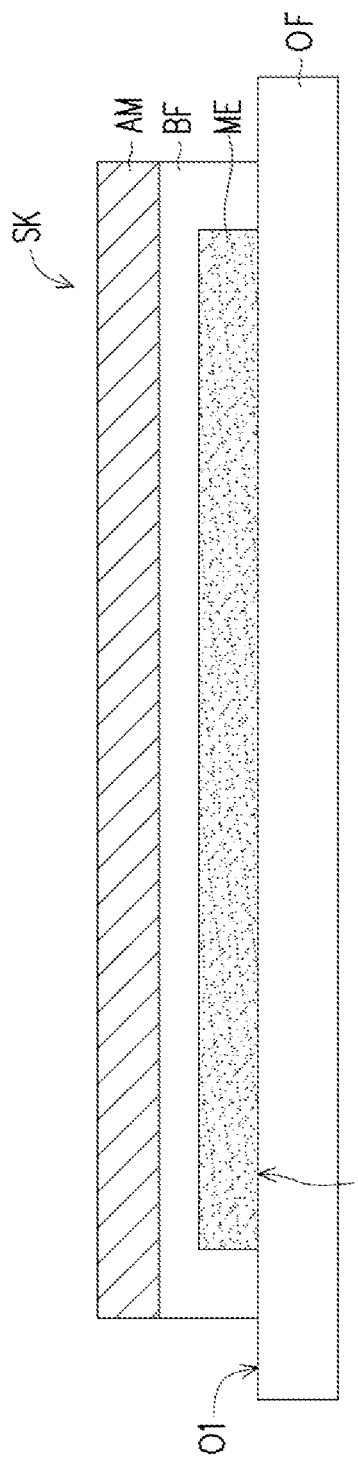

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Considering the measurement discussed and specific quantities of errors related to the measurement (that is, the limitation of the measuring system), the terms "around", "about", "approximately" or "substantially" as used herein shall mean the value described and an average value in an acceptable deviation range of the specific values ascertained by one of ordinary skill in the art. For example, the term "about" represents within one or more standard deviations of a given value of range, or within ±30 percent, within ±20 percent, within ±10 percent or within ±5 percent. Moreover, the terms "around", "about", "approximately" or "substantially" as used herein may selectively refer to a more acceptable deviation range or the standard deviation based on the optical characteristics, the etching characteristics or other characteristic, without applying one standard deviation to all characteristics.

FIG. 1A to FIG. 1D are sectional schematic views of the process of a manufacturing method of a transparent electronic device 10 according to one embodiment of the present disclosure. The embodiments of each step of the manufacturing method of the transparent electronic device 10 are described with the accompanying drawings, but they are not intended to limit the scope of the present disclosure in any way.

Firstly, referring to FIG. 1A, an opaque metal layer ME is formed on the substrate SB. The opaque metal layer ME may have surfaces M1, M2, in which the surface M2 faces the substrate SB. In the present embodiment, the substrate SB may be a transparent substrate, and the material thereof may be glass, but the present disclosure is not limited thereto. In certain embodiments, the material of the substrate SB may be an opaque/reflective material (for example, a wafer, ceramic, etc.), or other suitable materials.

A thickness of the opaque metal layer ME may be between 10 nm to 200 nm. For example, in the present embodiment, the thickness of the opaque metal layer ME may be about 50 nm, without being limited thereto. In certain embodiments, the thickness of the opaque metal layer ME may be 20 nm, 100 nm or 150 nm. Further, the method of forming the opaque metal layer ME may be chemical vapor deposition or physical vapor deposition. In the present embodiment, the opaque metal layer ME may be formed by physical vapor deposition. For example, the opaque metal layer ME may be formed by sputtering. In certain embodiments, the method of forming the opaque metal layer ME may further include lithography and etching processes, such that the opaque metal layer ME has the required pattern or contour. The material of the opaque metal layer ME may be selected from molybdenum (Mo), indium (In), tin (Sn), zinc (Zn), cadmium (Cd) and a combination thereof, but is not limited thereto.

In certain embodiments, prior to forming the opaque metal layer ME, a modified layer (not shown) may be firstly formed on the substrate SB. The modified layer may allow a weak bonding to be formed between the substrate SB and the opaque metal layer ME being formed afterwards, which helps the subsequent detachment of the opaque metal layer ME and the substrate SB.

Then, referring to FIG. 1B, in certain embodiments, a buffer layer BF is firstly formed on the surface M1 of the opaque metal layer ME, and then a matrix layer AM is formed on the buffer layer BF. The buffer layer BF may cover the opaque metal layer ME, and the matrix layer AM overlaps with the buffer layer BF. The buffer layer BF may prevent impurities from entering the matrix layer AM being formed subsequently, and prevent from unnecessary electric connection being generated between the opaque metal layer ME and the matrix layer AM. The buffer layer BF may be a single-layer or multi-layer structure, and the material thereof may be an inorganic material (for example, silicon oxide, silicon nitride, or silicon oxynitride), an organic material (for example, polyimide (PI), polyethylene terephthalate (PET), or polyethylene naphthalate (PEN)), or other suitable materials. In certain embodiments, a protecting layer may be further formed on the matrix layer AM, and the material thereof may be selected from an inorganic material (for example, silicon oxide, silicon nitride, or silicon oxynitride), an organic material (for example, PI, PET, or PEN), or other suitable materials.

Figure 2:
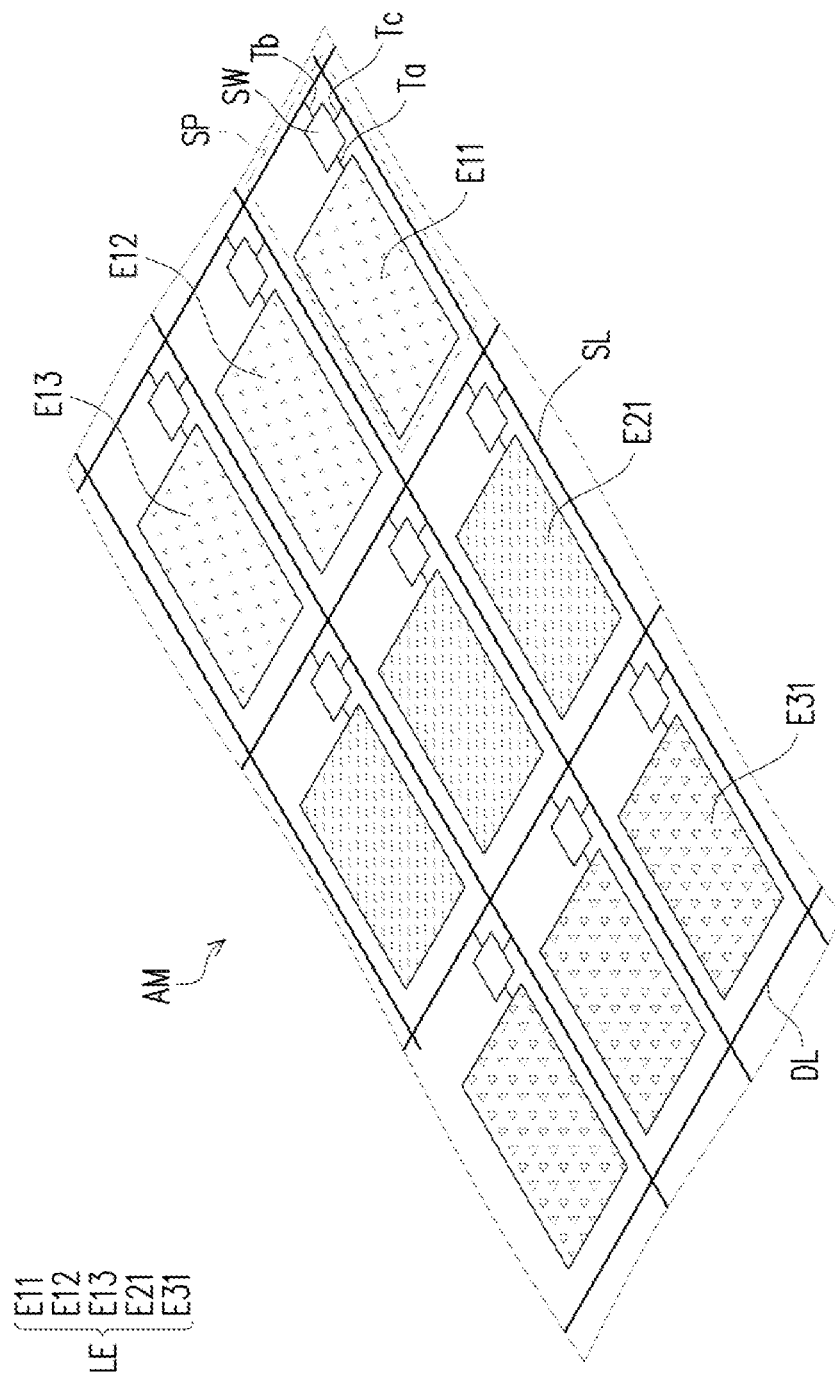
FIG. 2 is a partial top schematic view of a matrix layer AM of a transparent electronic device 10 according to one embodiment of the present disclosure.

Also referring to FIG. 2, which is a partial top schematic view of a matrix layer AM of a transparent electronic device 10 according to one embodiment of the present disclosure. In the present embodiment, the matrix layer AM may be a pixel layer, and include a plurality of sub-pixels SP, such that the transparent electronic device 10 may function as a transparent display device. The sub-pixels SP may be arranged in an array, and each sub-pixel SP may include at least one switch element SW, at least one display element LE and at least two signal lines SL, DL. The switch element SW may include a first end Ta, a second end Tb and a control end Tc. The first end Ta of the switch element SW may be electrically connected to the display element LE, the second end Tb of the switch element SW may be electrically connected to the signal line DL, and the control end Tc of the switch element SW may be electrically connected to the signal line SL. In certain embodiments, the switch element SW may be a thin film transistor (TFT), such as a top-gate TFT, a bottom-gate TFT or a dual-gate TFT, but is not limited thereto.

The signal line SL and the signal line DL may transmit electrical signals to the switch element SW. The signal line SL may be, for example, a scan line, and the signal line may be, for example, a data line. In the present embodiment, the signal line SL and the signal line DL may be perpendicular to each other, but the present disclosure is not limited thereto. In certain embodiments, the signal line SL and the signal line DL may intersect with each other at an angle of another degree. In certain embodiments, each sub-pixel SP may include two or more switch elements SW. In certain embodiments, the matrix layer AM may further be provided with other signal lines such as a power line, a common signal line, etc., to provide power signals and common signals to each sub-pixel SP.

In the present embodiment, the display element LE may be arranged in an array, and be electrically connected to the first end Ta of the switch element SW correspondingly. Through the switch element SW, the display element LE may be electrically connected to one of the signal lines DL correspondingly. The display elements LE of the sub-pixels SP electrically connected to the same one of the signal lines DL (for example, the display elements E11, E12, E13) may emit light of the same color, and the display elements LE of the sub-pixels SP electrically connected to the same one of the signal lines SL (for example, the display elements E11, E21, E31) may emit light of different colors.

In the present embodiment, the display element LE may be a self-luminous element, for example, an organic light emitting diode (OLED) or a micro light emitting diode (micro LED), etc., but the present disclosure is not limited thereto. In certain embodiments, the display element LE may be a non-self-luminous element. For example, the display element LE may include a pixel electrode and a non-self-luminous medium, such as a liquid crystal layer. The switch element SW may individually control the corresponding pixel electrode to drive the liquid crystal molecules in the liquid crystal layer to be reoriented.

Then, referring to FIG. 1C, the substrate SB on the surface M2 of the opaque metal layer ME is removed, and an organic film OF is formed on the surface M2 of the opaque metal layer ME. For example, the organic film OF is attached onto the surface M2 of the opaque metal layer ME, thus forming a stack layer SK.

Since a weak bonding is formed between the substrate SB and the opaque metal layer ME, the substrate SB may be removed by stripping with a mechanical force, without being limited thereto. In certain embodiments, the substrate SB may be removed by laser oxidizing the opaque metal layer ME. In certain embodiments, a laser beam may be simultaneously used to cut the overlapping portions of the matrix layer AM, the buffer layer BF and the opaque metal layer ME above the substrate SB, and then the organic film OF is attached onto the surface M2 of the opaque metal layer ME.

In the present embodiment, a width of the organic film OF is slightly greater than a width of the matrix layer AM, without being limited thereto. In certain embodiments, the width of the organic film OF may be substantially equal to or less than the width of the matrix layer AM. Further, the material of the organic film OF may include a polymer containing carboxyl groups (—COOH), such as polyurethane (PU), polymethylmethacrylate (PMMA), polyester, polyethylene terephthalate, or a combination thereof.

Figure 1D:
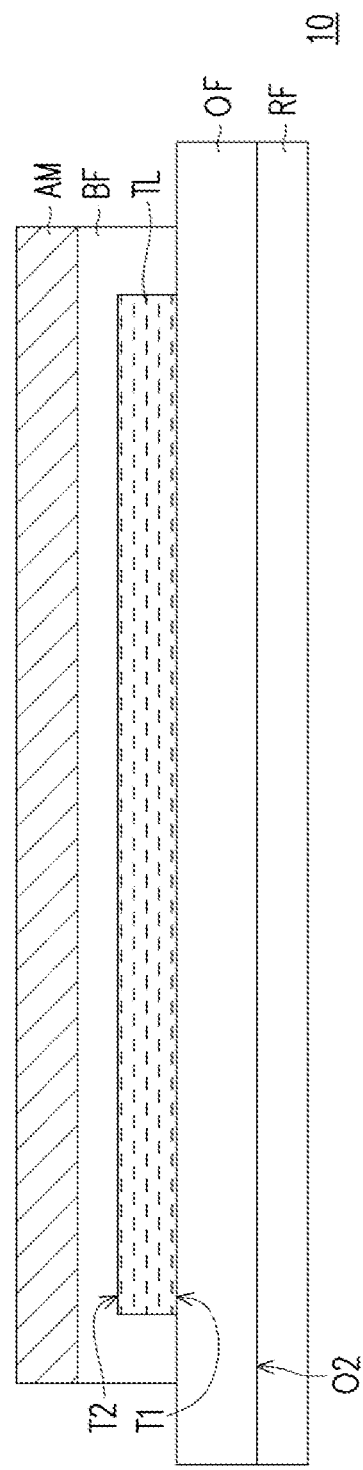

Then, the stack layer SK is disposed in a processing environment to perform processing, in order to transform the opaque metal layer ME to an amorphous transparent oxycarbide layer TL, thus forming the transparent electronic device 10 as shown in FIG. 1D. Referring to FIG. 1D, in the transparent electronic device 10, the amorphous transparent oxycarbide layer TL is disposed on the organic film OF, and the matrix layer AM is located on the amorphous transparent oxycarbide layer TL. In certain embodiments, the organic film OF may serve as the supporting plate of the transparent electronic device 10. In certain embodiments, a transparent assisting film RF may be further formed on a surface 02 of the organic film OF, thus enhancing the supporting capacity of the transparent electronic device 10. The material of the transparent assisting film RF may be, for example, glass, polyimide, acrylic or other suitable materials.

Generally, the processing environment may be a high temperature, high humidity environment, causing the carbon atoms and oxygen atoms in the organic film OF and the environment to enter the opaque metal layer ME and to react with the metal, thus forming the amorphous metal oxycarbide. Specifically, the temperature of the processing environment may be between room temperature and a melting point of the organic film OF, a relative humidity of the processing environment may be between 70% and 100%, and a processing time of the stack layer SK in the processing environment may be between 1 hour and 100 hour, without being limited thereto. Further, the processing time may be shortened with the increase of the temperature or the relative humidity, and/or the reduction of the thickness of the opaque metal layer ME.

For example, in the present embodiment, the opaque metal layer ME in the stack layer SK is a molybdenum layer with a thickness of about 50 nm, and polyurethane (PU) is used as the material of the organic film OF to form an experimental group, and the stack layer SK is processed at a temperature of about 60° C. and a relative humidity of about 90% for about 4 hours. Meanwhile, another controlled stack layer is designed as a control group for comparison. The difference between the controlled stack layer of the control group and the stack layer SK of the experimental group exists merely in that the organic film OF is substituted by an epoxy film. After the processing, transmittances of the stack layer SK of the experimental group and the controlled stack layer of the control group are measured respectively.

Figure 3:
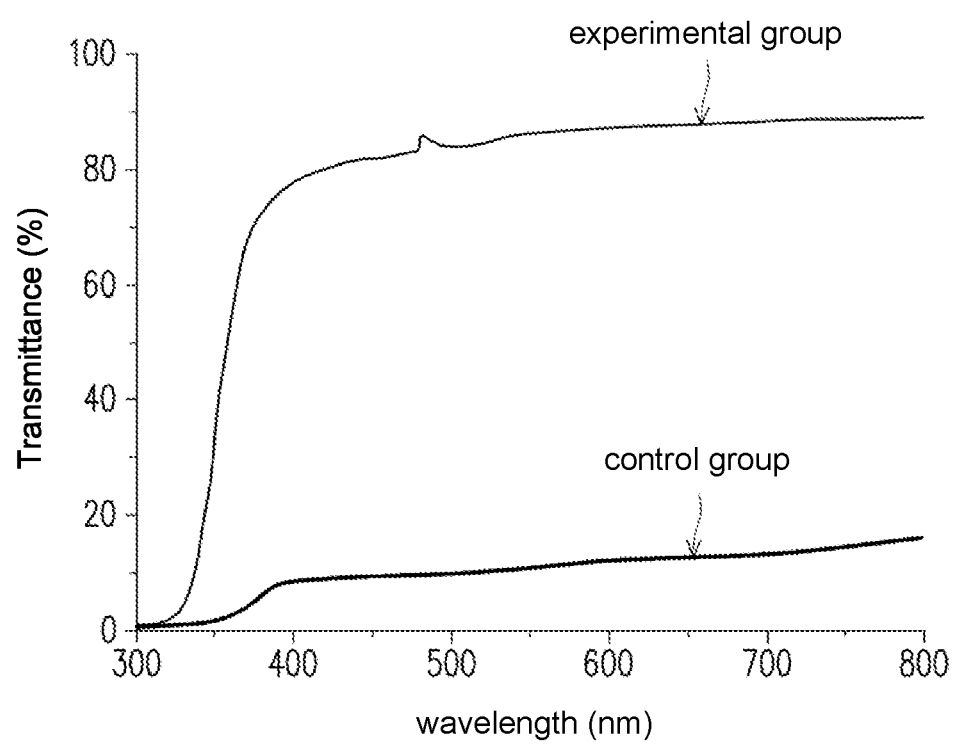
FIG. 3 is a curve chart of transmittance of the stack layer SK of the experimental group and the control group according to one embodiment of the present disclosure.

FIG. 3 is a curve chart of transmittance of the stack layer SK of the experimental group and the control group according to one embodiment of the present disclosure. As illustrated in FIG. 3, the transmittance of the controlled stack layer of the control group for a visible light with a wavelength between 400 nm and 800 nm is lower than 20%. However, the transmittance of the stack layer SK of the experimental group for the visible light with a wavelength between 400 nm and 800 nm is higher than 80%, thus confirming that the opaque metal layer ME may be transformed to the amorphous transparent oxycarbide layer TL with high transmittance by utilizing the organic film OF including the polymer containing carboxyl groups (—COOH) and through the processing. In certain embodiments, when the thickness of the opaque metal layer ME of the stack layer SK is 20 nm, the opaque metal layer ME may be transformed to the amorphous transparent oxycarbide layer TL with high transmittance by processing in a 90° C. and 90% high-temperature, high humidity environment for about 1 hours.

Figure 4:
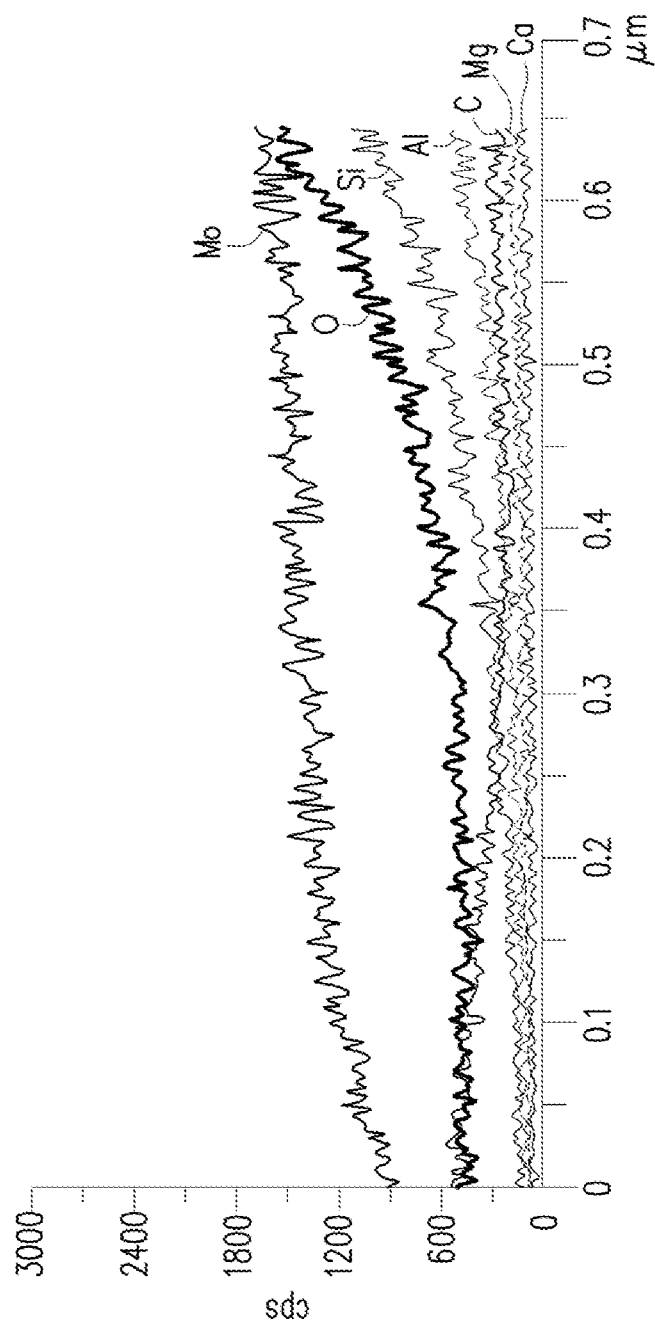
FIG. 4 is a Secondary Ion Mass Spectroscopy (SIMS) analytic chart of an amorphous transparent oxycarbide layer TL according to one embodiment of the present disclosure.

In addition, composition analysis of the amorphous transparent oxycarbide layer TL is further performed. FIG. 4 is a Secondary Ion Mass Spectroscopy (SIMS) analytic chart of an amorphous transparent oxycarbide layer TL according to one embodiment of the present disclosure. Also referring to FIG. 1D, the X-axis of FIG. 4 represents the composition change from a surface T1 of the amorphous transparent oxycarbide layer TL close to the organic film OF toward a surface T2 thereof close to the matrix layer AM. As illustrated in FIG. 4, the atomic number percentage of the carbon element at one side of the amorphous transparent oxycarbide layer TL close to the matrix layer AM (that is, the location close to the surface T2) is less than the atomic number percentage of the carbon element at the other side of the amorphous transparent oxycarbide layer TL close to the organic film OF (that is, the location close to the surface T1), and the atomic number percentage of the oxygen element at one side of the amorphous transparent oxycarbide layer TL close to the matrix layer AM (that is, the location close to the surface T2) is greater than the atomic number percentage of the oxygen element at the other side of the amorphous transparent oxycarbide layer TL close to the organic film OF (that is, the location close to the surface T1). In other words, the atomic number percentage of the carbon element in the amorphous transparent oxycarbide layer TL is substantially gradually reduced in a direction from the organic film OF toward the matrix layer AM, and the atomic number percentage of the oxygen element in the amorphous transparent oxycarbide layer TL is substantially gradually increased in the direction from the organic film OF toward the matrix layer AM.

In addition, as illustrated in FIG. 4, at the side of the amorphous transparent oxycarbide layer TL close to the matrix layer AM, an average atomic number percentage of the molybdenum element is greater than an average atomic number percentage of the carbon element, and at the other side of the amorphous transparent oxycarbide layer TL close to the organic film OF, the average atomic number percentage of the molybdenum element is greater than or equal to the average atomic number percentage of the carbon element. In other words, at various locations in the amorphous transparent oxycarbide layer TL, the atomic number percentage of the molybdenum element is substantially greater than the atomic number percentage of the carbon element. Moreover, at the side of the amorphous transparent oxycarbide layer TL close to the matrix layer AM, an average atomic number percentage of the oxygen element is greater than an average atomic number percentage of the carbon element, and at the other side of the amorphous transparent oxycarbide layer TL close to the organic film OF, the average atomic number percentage of the oxygen element may be less than or equal to the average atomic number percentage of the carbon element. Evidently, the oxygen element mainly diffuses in a direction from the surface T1 close to the organic film OF toward the surface T2 close to the matrix layer AM. Further, after the opaque metal layer ME is performed with carbon oxidizing to be transformed to the amorphous transparent oxycarbide layer TL, the thickness thereof is slightly increased.

As shown in FIG. 4, in the amorphous transparent oxycarbide layer TL, apart from the metal element, the carbon element and the oxygen element, there may be an additional element existing from impurities or additives, such as calcium (Ca), magnesium (Mg), aluminum (Al), silicon (Si) or barium (Ba), etc. The atomic number percentage of the additional element is generally less than the atomic number percentage of the metal element, the atomic number percentage of the oxygen element and the atomic number percentage of the carbon element. In other words, the additional element exists in the amorphous transparent oxycarbide layer TL only in a minimized or almost negligible amount. Thus, the atomic number percentage of the additional element may be equal to zero or greater than zero, and the atomic number percentage of the additional element is less than the least of the atomic number percentage of the metal element, the atomic number percentage of the oxygen element and the atomic number percentage of the carbon element. From the SIMS analytic result as shown in FIG. 4, in the amorphous transparent oxycarbide layer TL, a sum of the atomic number percentage of the metal element, the atomic number percentage of the oxygen element, the atomic number percentage of the carbon element and the atomic number percentage of the additional element is 100%.

In sum, the transparent electronic device and the manufacturing method thereof utilize an organic film containing carboxyl groups (—COOH) in order to transform the opaque metal layer to an amorphous transparent oxycarbide layer, thus facilitating manufacturing of the transparent electronic device with high transmittance without the need to remove the opaque metal layer.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A manufacturing method of a transparent electronic device, comprising:
   forming a matrix layer on a first surface of an opaque metal layer;
   forming an organic film on a second surface of the opaque metal layer, thus forming a stack layer, wherein the organic film comprises a polymer containing carboxyl groups (—COOH); and
   disposing the stack layer in a processing environment in order to transform the opaque metal layer to an amorphous transparent oxycarbide layer, wherein the amorphous transparent oxycarbide layer is formed by a metal element, carbon element, oxygen element and an additional element, the metal element is selected from molybdenum (Mo), indium (In), tin (Sn), zinc (Zn), cadmium (Cd) and a combination thereof, and an atomic number percentage of the additional element is equal to or greater than 0% and is less than the least of an atomic number percentage of the metal element, an atomic number percentage of the oxygen element and an atomic number percentage of the carbon element.

2. The manufacturing method according to claim 1, wherein a temperature of the processing environment is between room temperature and a melting point of the organic film, a relative humidity of the processing environment is between 70% and 100%, and a processing time of the stack layer in the processing environment is between 1 hour and 100 hour.

3. The manufacturing method according to claim 1, further comprising: prior to forming the matrix layer, forming a buffer layer on the first surface of the opaque metal layer.

4. The manufacturing method according to claim 1, further comprising: forming a transparent assisting film on a surface of the organic film opposite to the amorphous transparent oxycarbide layer.

5. The manufacturing method according to claim 1, wherein the atomic number percentage of the carbon element in the amorphous transparent oxycarbide layer is gradually reduced in a direction from the organic film toward the matrix layer, and the atomic number percentage of the oxygen element in the amorphous transparent oxycarbide layer is gradually increased in the direction from the organic film toward the matrix layer.

6. The manufacturing method according to claim 1, wherein at a first side of the amorphous transparent oxycarbide layer close to the matrix layer, an average atomic number percentage of the metal element is greater than an average atomic number percentage of the carbon element, and at a second side of the amorphous transparent oxycarbide layer close to the organic film, the average atomic number percentage of the metal element is greater than or equal to the average atomic number percentage of the carbon element.

7. The manufacturing method according to claim 1, wherein at a first side of the amorphous transparent oxycarbide layer close to the matrix layer, an average atomic number percentage of the oxygen element is greater than an average atomic number percentage of the carbon element, and at a second side of the amorphous transparent oxycarbide layer close to the organic film, the average atomic number percentage of the oxygen element is less than or equal to the average atomic number percentage of the carbon element.

8. The manufacturing method according to claim 1, wherein the matrix layer comprises a plurality of switch elements.

9. The manufacturing method according to claim 1, wherein the matrix layer is a pixel layer, and the transparent electronic device is a transparent display device.

10. The manufacturing method according to claim 1, wherein the polymer containing the carboxyl groups is selected from polyurethane, polymethyl methacrylate, polyester, polyethylene terephthalate and a combination thereof, and the additional element includes at least one of calcium (Ca), magnesium (Mg), aluminum (Al), silicon (Si) and barium (Ba).

* * * * *